United States Patent [19]

Cooney et al.

[11] Patent Number: 4,560,223
[45] Date of Patent: Dec. 24, 1985

[54] SELF-CLEANING TRI-CUSP SIGNAL CONTACT

[75] Inventors: James S. Cooney, Attleboro; Stephen A. Boyle, Seekonk, both of Mass.

[73] Assignee: Pylon Company, Inc., Attleboro Falls, Mass.

[21] Appl. No.: 626,402

[22] Filed: Jun. 29, 1984

[51] Int. Cl.[4] ............................................. G01R 1/06
[52] U.S. Cl. ................................ 339/95 R; 324/158 P
[58] Field of Search ................... 339/95 R, 96, 252 R, 339/255 R, 108 T, 150 B; 324/72.5, 158 F, 158 P

[56] References Cited

U.S. PATENT DOCUMENTS 4,417,206 11/1983 Stowers ............................ 324/158 P Primary Examiner—Neil Abrams
Attorney, Agent, or Firm—Weingarten, Schurgin, Gagnebin & Hayes

[57] ABSTRACT

A three-cusp self-cleaning signal contact is disclosed that is structurally strong and breakage resistant, that is capable of cutting through any surface contamination present on intended contact points for insuring a good electrical interconnection, and that is self-cleaning and capable of repetitive use notwithstanding a comparatively large quantity of surface contamination.

4 Claims, 5 Drawing Figures

SELF-CLEANING TRI-CUSP SIGNAL CONTACT

FIELD OF THE INVENTION

This invention is directed to the field of interconnection components, and more particularly, to a novel self-cleaning tri-cusp signal contact.

BACKGROUND OF THE INVENTION

Spring-loaded signal contacts such as POGO contacts are routinely employed for removably contacting selected contact points and plated-through holes of electronic circuits and components, which are often corroded by a film of dirt, dust, and the like. Various signal contact heads have been devised to provide surfaces that cut through the surface layer of contaminant to establish and maintain the intended electrical contact between the contact head and the contact points. Such signal contact heads are thus called upon to provide a self-cleaning action that is capable of repetitively contacting corroded contact points and of accomodating relatively large quantities of surface contaminant without impairing its ability to repetitively provide the intended electrical interconnection path, to be durable in use and to have such a strength as to preserve its ability to provide electrical contact without undesirable breakage of its contacting portions, and at the same time to define cutting edges of a sharpness sufficient to cut through the surface contamination to provide the intended electrical connection. The heretofore known signal contact have heads that are defective in one or more of these features.

SUMMARY OF THE INVENTION

The novel self-cleaning tri-cusp signal contact of the present invention is inherently stronger than the heretofore known signal contacts, is capable of self-cleaning action that removes comparatively larger quantities of contaminant than heretofore possible, provides cutting edges of a high degree of sharpness that cut through surface contaminant which is directed away from the edges to preserve the ability of the contact to repetitively make the intended electrical interconnection, and that is capable of mechanically contacting and electrically connecting not only contact points of electronic circuits and components but also has the versatility to so engage plated-through holes as well. In preferred embodiment, the signal contact of the present invention includes an enlarged head having three substantially identical longitudinally extending cusp portions that are integrally formed on an end thereof and laterally spaced circumferentially by substantially V-shaped grooves. The intersection of the grooves define a common nadir and three interior knife edges each associated with a corresponding cusp and extending from the nadir at an angle generally transverse to the long axis of the signal contact. Each cusp includes first and second beveled surfaces that cooperate with each other and with laterally adjacent ones of the V-shaped grooves to define three axially inclined knife edges located on the outer periphery of each cusp.

The three-cusp head is very strong mechanically and resists impact induced and other breakage. The knife edges of each cusp slice through surface contamination which is discharged to the V-shaped grooves integrally formed with the head between adjacent ones of the cusps. The V-shaped grooves, due to their inclination and channel width, among others, are capable of accomodating comparatively larger quantities of surface contaminant without jamming action than heretofore possible. The knife edges on each cusp of the head are simultaneously operative to insure both good mechanical contact and electrical contact with the intended contact points of the electronic circuit or components, and with the plated-through holes. The three outer knife edges define knife angles that are sharper than heretofore available that readily slice through contaminant when probing plated-through holes.

The signal contact of the present invention in an illustrated embodiment is mounted in a sleeve with its contact head extending from an end thereof. A spring is mounted in the sleeve and around the head for biasing the head outwardly.

BRIEF DESCRIPTION OF THE DRAWINGS

These and other features and advantages of the present invention will become apparent as the invention becomes better understood by referring to the following exemplary and solely non-limiting detailed description of the preferred embodiments, and to the drawings, wherein.

DETAILED DESCRIPTION OF THE PREFERRED EMBODIMENTS

Figure 1:
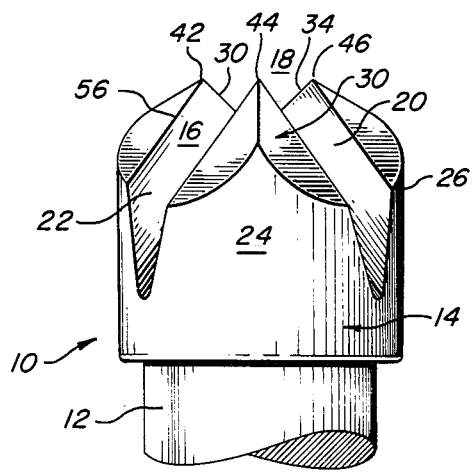
FIG. 1 is a fragmentary elevational view of a side of the novel self-cleaning tri-cusp signal contact according to the present invention.
Figure 2:
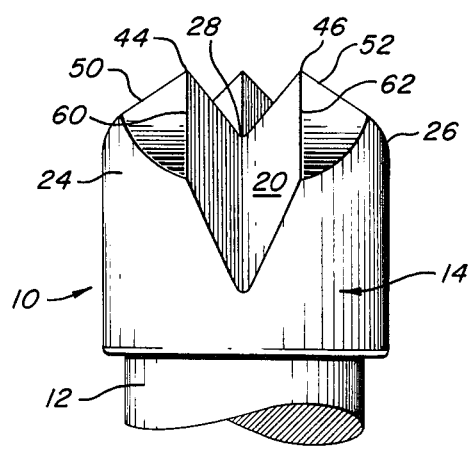
FIG. 2 is a fragmentary elevational view of another side of the self-cleaning tri-cusp signal contact according to the present invention.
Figure 3:
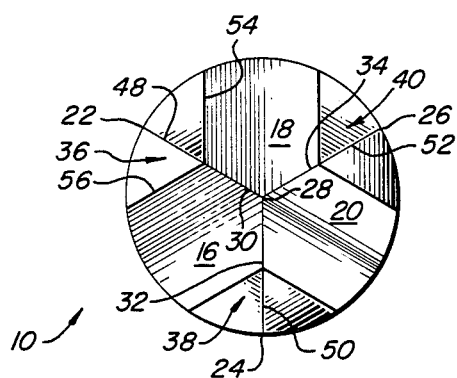
FIG. 3 is a plan view of the self-cleaning tri-cusp signal contact according to the present invention.
Figure 4:
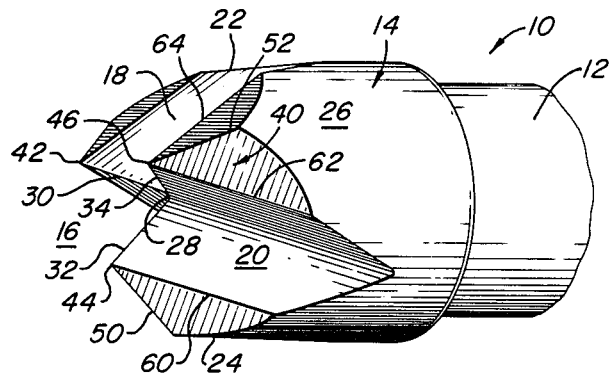
FIG. 4 is a fragmentary isometric view of the self-cleaning tri-cusp signal contact according to the present invention.

Referring now to FIGS. 1-4, generally designated at 10 is the self-cleaning tri-cusp signal contact according to the present invention. The signal contact 10 includes a longitudinally extending shaft 12 and an enlarged contact head generally designated 14 integrally formed with the shaft 12.

The head 14 includes three generally V-shaped grooves generally designated 16, 18, 20. Each V-shaped groove 16, 18, 20 is radially extending and is inclined at an angle generally transverse to the longitudinal axis of the head 14. The V-shaped grooves 16, 18, 20 are circumferentially symmetrically disposed preferably at a 120° angle to each other defining three circumferentially symmetrically disposed and longitudinally extending cusps 22, 24, 26. The cusps 22, 24, 26 are circumferentially symmetrically disposed preferably at a 120° angle to each other. The intersection of the three V-shaped grooves 16, 18, 20 define a nadir 28 located along the longitudinal axis of the head 14, and three interior knife edges 30, 32, 34 extending from the nadir generally transverse to the longitudinal axis of the head 14.

The cusp 22 includes a substantially V-shaped beveled surface generally designated 36 integrally formed with the head 14 and on the exterior surface of the cusp 22. The cusp 24 includes a substantially V-shaped beveled surface generally designated 38 integrally formed with the head 14 and on the exterior surface of the cusp 24. The cusp 26 includes a substantially V-shaped beveled surface generally designated 40 integrally formed with the head 14 and on the exterior surface of the cusp 26.

Each of the V-shaped surfaces 36, 38, 40 of the cusps 22, 24, 26 intersect the surfaces of adjacent ones of the V-shaped grooves 16, 18, 20 defining apexes 42, 44, 46 each longitudinally spaced beyond the nadir 28 and radially outwardly spaced to a preselected point located on an inside diameter circumference of the head 14.

The inside knife edges 30, 32, 34 are tangent to an imaginary cone whose apex is centered at the nadir 28, and whose base terminates at the plane defined by the apexes 42, 44, 46 of the cusps 22, 24, 26. The two surfaces constituting each of the V-shaped beveled surfaces 36, 38, 40 of the cusps 22, 24, 26 intersect and define outside knife edges 48, 50, and 52. Individual ones of the surfaces that constitute the V-shaped beveled surfaces 36, 38, 40 intersect adjacent ones of the surfaces that constitute corresponding ones of the grooves 16, 18, 20 defining outside knife edges 54, 56 on the cusp 22, outside knife edges 58, 60 on the cusp 24, and outside knife edges 62, 64 on the cusp 26.

Figure 5:
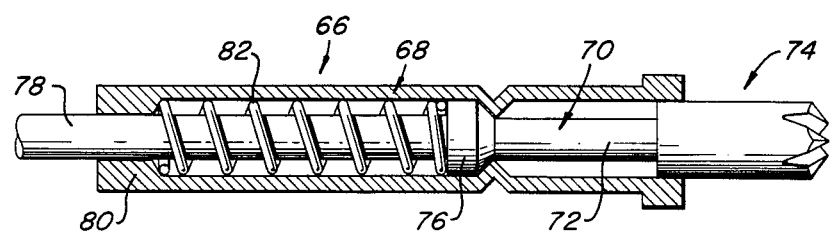
FIG. 5 is a side elevational view of one embodiment of the self-cleaning tri-cusp signal contact according to the present invention.

Referring now to FIG. 5, generally designated at 66 is a sectional view of a self-cleaning tri cusp signal contact according to the present invention. The signal contact 66 includes a sleeve generally designated 68, and a piston generally designated 70 mounted for sliding movement in the sleeve 68. The piston 70 includes a shaft 72 having on one end an integral head generally designated 74 substantially of the type as described above in connection with the description of FIGS. 1–4, an intermediate flange 76, and an extending portion 78 that extends beyond the other end of the sleeve 68. The sleeve 68 includes an annular internal lip portion 80 on the end thereof through which the rod 78 extends, and a spring 82 is mounted between and abutting the lip 80 and the member 76 for urging the head 74 outwardly.

Many modifications of the presently disclosed invention will become apparent to those skilled in the art without departing from the scope of the appended claims.

What is claimed is:
1. A self-cleaning tri-cusp signal contact, comprising:
a shaft defining a longitudinal axis;
a head, having an outer surface, integrally formed on one end of said shaft and symmetrically about said longitudinal axis;
said head consisting of three longitudinally extending and circumferentially spaced cusps each having a free end;
circumferentially adjacent ones of said cusps defining therebetween a corresponding one of three circumferentially spaced grooves, each radially extending in a direction generally transverse to said longitudinal axis of said shaft, that intersect and define a nadir located on the longitudinal axis and interior of said head at a point spaced from the orthogonal projection of the free ends of said cusps on the longitudinal axis;
each of said free ends of said cusps including first and second beveled surfaces integrally formed with said outer surface that respectively intersect circumferentially adjacent ones of said grooves defining first and second external knife edges where said first and said second beveled surfaces respectively intersect corresponding ones of said circumferentially adjacent grooves, said first and said second beveled surfaces intersect each other defining a third external knife edge where said first and said second beveled surfaces intersect each other;
each of said free ends of said cusps including an apex at the common intersection of said first beveled surface, said second beveled surface, and said corresponding ones of said circumferentially adjacent grooves that is located at a point positioned on a circumference of the head defined interiorly of the outer surface of the head and radially outwardly of said longitudinal axis;
each of said free ends of said cusps defining an interior knife edge extending from said nadir to its associated apex along an axis generally transverse to said longitudinal axis where corresponding ones of said circumferentially adjacent grooves intersect each other;
each of said first, second, and third knife edges terminating at the apex of a corresponding cusp.
2. The invention of claim 1, wherein said head is enlarged relative to said shaft.
3. The invention of claim 2, wherein said grooves are substantially V-shaped.
4. The invention of claim 3, wherein said first and second beveled surfaces are substantially V-shaped when externally viewed.

* * * * *